United States Patent
Riley et al.

(10) Patent No.: US 6,324,341 B1
(45) Date of Patent: Nov. 27, 2001

(54) LOT-TO-LOT RAPID THERMAL PROCESSING (RTP) CHAMBER PREHEAT OPTIMIZATION

(75) Inventors: Terrence J. Riley; Qingsu Wang, both of Austin; Michael Miller, Cedar Park; William Jarrett Campbell, Austin; Jeff Thompson, Round Rock, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/559,147

(22) Filed: Apr. 26, 2000

Related U.S. Application Data

(60) Provisional application No. 60/132,019, filed on Apr. 30, 1999.

(51) Int. Cl.$^7$ ..................................................... F26B 19/00
(52) U.S. Cl. ........................ 392/416; 219/390; 219/405; 118/724; 118/728; 118/50.1; 392/418
(58) Field of Search ................................... 219/390, 405, 219/411, 494, 497; 118/724, 725, 728, 715, 729, 50.1; 392/416, 418

(56) References Cited

U.S. PATENT DOCUMENTS

| | | | |
|---|---|---|---|
| 4,924,073 * | 5/1990 | Chiba | 219/413 |
| 5,994,676 * | 11/1999 | Dutartre | 219/497 |
| 6,130,105 * | 10/2000 | Redinbo et al. | 438/16 |
| 6,151,446 * | 11/2000 | Hunter et al. | 392/416 |
| 6,175,103 * | 1/2000 | Lam et al. | 219/506 |

* cited by examiner

Primary Examiner—Teresa Walberg
Assistant Examiner—Shawtina T. Fuqua
(74) Attorney, Agent, or Firm—Williams, Morgan & Amerson

(57) ABSTRACT

A method is provided, the method comprising preheating a rapid thermal processing chamber according to a preheating recipe and processing a first plurality of workpieces in the rapid thermal processing chamber. The method also comprises performing first parameter measurements on first and second workpieces of the first plurality of workpieces, the first parameter measurements indicative of first processing differences between the first and second workpieces, and forming a first output signal corresponding to the first parameter measurements. The method further comprises adjusting the preheating recipe based on the first output signal and using the adjusted preheating recipe to preheat the rapid thermal processing chamber for processing a second plurality of workpieces in the rapid thermal processing chamber to reduce second processing differences between first and second workpieces of the second plurality of workpieces.

20 Claims, 8 Drawing Sheets

US 6,324,341 B1

LOT-TO-LOT RAPID THERMAL PROCESSING (RTP) CHAMBER PREHEAT OPTIMIZATION

SPECIFIC REFERENCE TO PROVISIONAL APPLICATION

The present application claims priority to provisional application Ser. No. 60/132,019 filed Apr. 30, 1999, the entire text and figures of which are incorporated herein by reference without disclaimer.

BACKGROUND OF THE INVENTION

1. Field of the Invention

This invention relates generally to semiconductor fabrication technology, and, more particularly, to a method for optimizing semiconductor processing.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are the temperatures and lamp power levels that silicon wafers are exposed to during rapid thermal processing (RTP) used to activate dopant implants, for example. An RTP chamber heats up during successive wafer processing so that the thermal environment experienced by early wafers will be different from the thermal environment experienced by later wafers. For example, if the RTP chamber is not preheated, the first wafers will be run in a colder RTP chamber than later wafers. This will cause differences in wafer processing within a lot of wafers, leading to decreased satisfactory wafer throughput, decreased reliability, decreased precision and decreased accuracy in the semiconductor manufacturing process.

Sub-optimal preheating may also be problematic. For example, a manufacturer of rapid thermal annealing (RTA) tools provides a quartz tube temperature reading to the tool user to better understand the process conditions, and states that by preheating the tool (with a recipe similar to the production process recipe) to a set tube temperature, the tube temperature traces from the 1st workpiece can be made to overlap the tube temperature traces from the 2nd through 25th workpieces, and, thus the system is properly preheated. From experiments that have been conducted and the resulting experimental data, this preheat has been found to be insufficient and sub-optimal. The 1st workpiece received more of an anneal (a higher temperature) than the rest of the lot (a "1st workpiece effect"). This again caused differences in wafer processing within a lot of wafers, leading to decreased satisfactory wafer throughput, decreased reliability, decreased precision and decreased accuracy in the semiconductor manufacturing process.

The present invention is directed to overcoming, or at least reducing the effects of, one or more of the problems set forth above.

SUMMARY OF THE INVENTION

In one aspect of the present invention, a method is provided, the method comprising preheating a rapid thermal processing chamber according to a preheating recipe and processing a first plurality of workpieces in the rapid thermal processing chamber. The method also comprises performing first parameter measurements on first and second workpieces of the first plurality of workpieces, the first parameter measurements indicative of first processing differences between the first and second workpieces, and forming a first output signal corresponding to the first parameter measurements. The method further comprises adjusting the preheating recipe based on the first output signal and using the adjusted preheating recipe to preheat the rapid thermal processing chamber for processing a second plurality of workpieces in the rapid thermal processing chamber to reduce second processing differences between first and second workpieces of the second plurality of workpieces.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIG. 1 schematically illustrates in cross-section an AST SHS 2800 rapid thermal anneal (RTA) tool used in various embodiments of the present invention;

FIG. 2 schematically illustrates a pyrometer trace for an optimal preheat in various embodiments of the present invention;

FIG. 3 schematically illustrates a lamp power trace for an optimal preheat in various embodiments of the present invention;

FIG. 4 schematically illustrates a tube temperature trace for an optimal preheat in various embodiments of the present invention;

FIG. 5 schematically illustrates tube temperature traces for rapid thermal processing of a first workpiece and any one of the subsequent workpieces in a run following an optimal preheat in various embodiments of the present invention;

FIG. 6 schematically illustrates a tube temperature trace for an optimal preheat in various embodiments of the present invention followed by a tube temperature trace for rapid thermal processing of a first workpiece;

FIG. 7 schematically illustrates lamp power traces for rapid thermal processing of a first workpiece and any one of the subsequent workpieces in a run following an optimal preheat in various embodiments of the present invention; and FIG. 8 schematically illustrates pyrometer traces for rapid thermal processing of a first workpiece and any one of the subsequent workpieces in a run following an optimal preheat in various alternative embodiments of the present invention.

Figure 1:
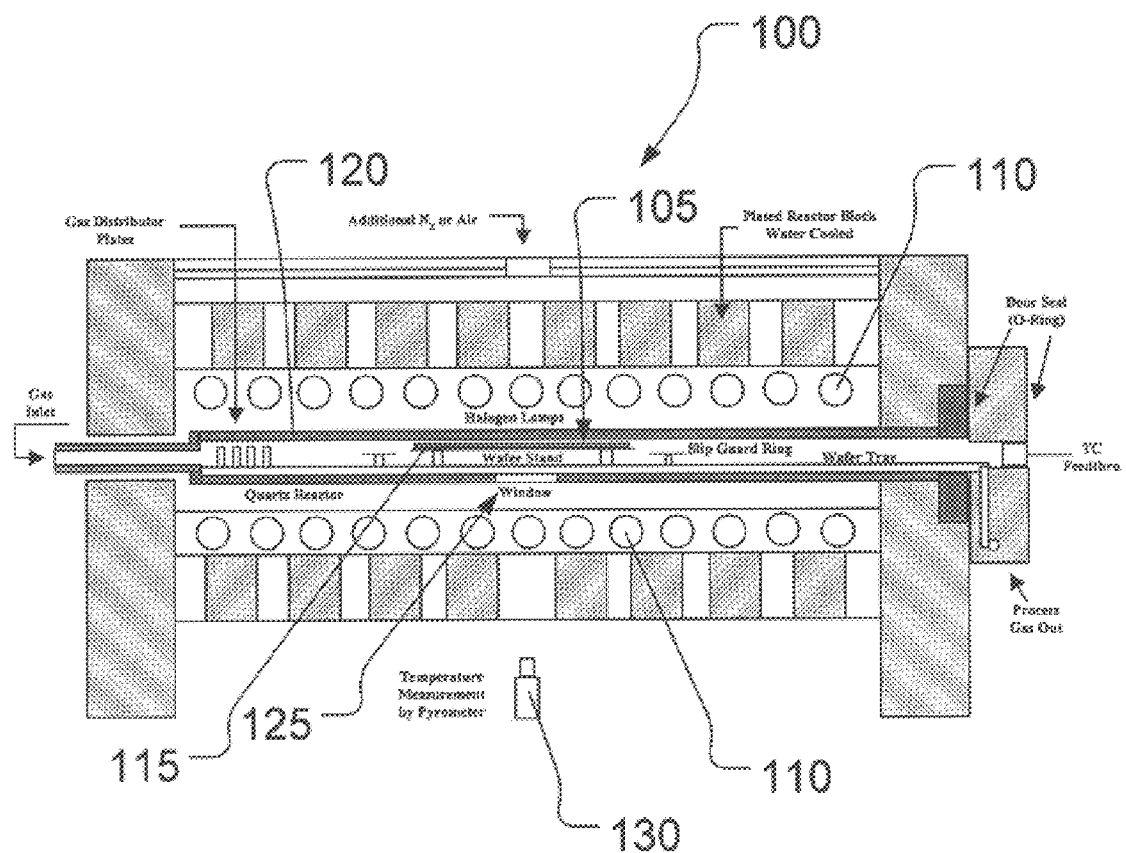
FIGS. 1–8 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–8. FIG. 1 schematically illustrates in cross-section an AST SHS 2800 rapid thermal anneal (RTA) tool 100. Various alternative embodiments of the present invention use RTA tools (such as the Centura® RTP) manufactured by Applied Materials (AMAT), which are quite different in physical form, usage, and measured parameters, but which may, nonetheless, also be used in various alternative embodiments of the present invention.

As shown in FIG. 1, the RTA tool 100 may heat a workpiece 105, such as a semiconducting silicon wafer with zero, one, or more process layers formed thereon, by using an array of halogen lamps 110 disposed above and below the workpiece 105. The workpiece 105 may be disposed on quartz pins and a wafer stand 115, which may include other components, such as an AST Hot Liner™, within a quartz tube 120 heated by the array of halogen lamps 110. The temperature of the quartz tube 120 may be measured by a thermocouple and/or a pyrometer 130 that measures the temperature of the AST Hot Liner™ component of the wafer stand 115 and/or a separate pyrometer (not shown). The quartz tube 120 may have a quartz window 125 disposed therein below the wafer stand 115. The temperature of the AST Hot Liner™ component of the wafer stand 115, and, indirectly, the workpiece 105 may be measured through the quartz window 125 by the pyrometer 130 disposed below the quartz window 125. Alternatively, the pyrometer 130 disposed below the quartz window 125 may directly measure the temperature of the workpiece 105. The lamp power of the halogen lamps 110 may also be monitored and controlled.

Figure 2:
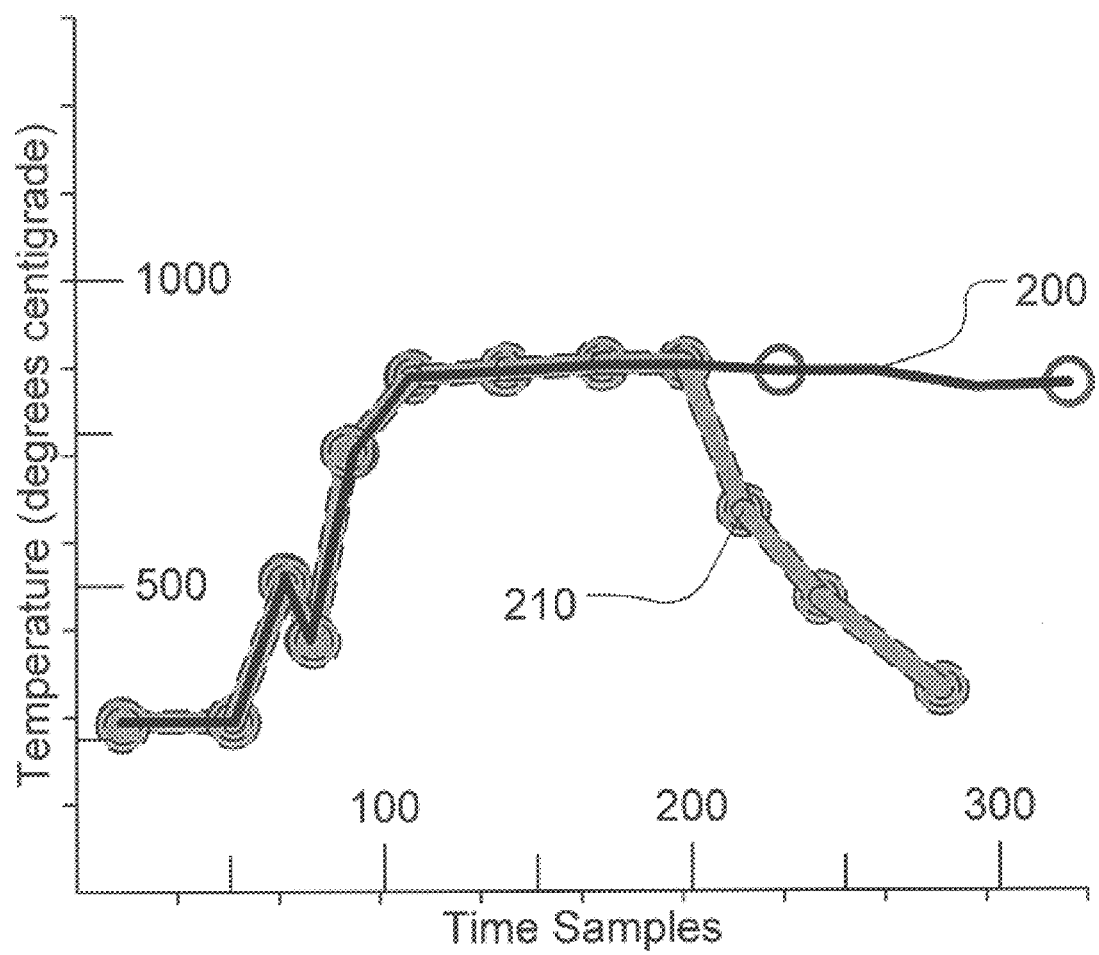
Figure 3:
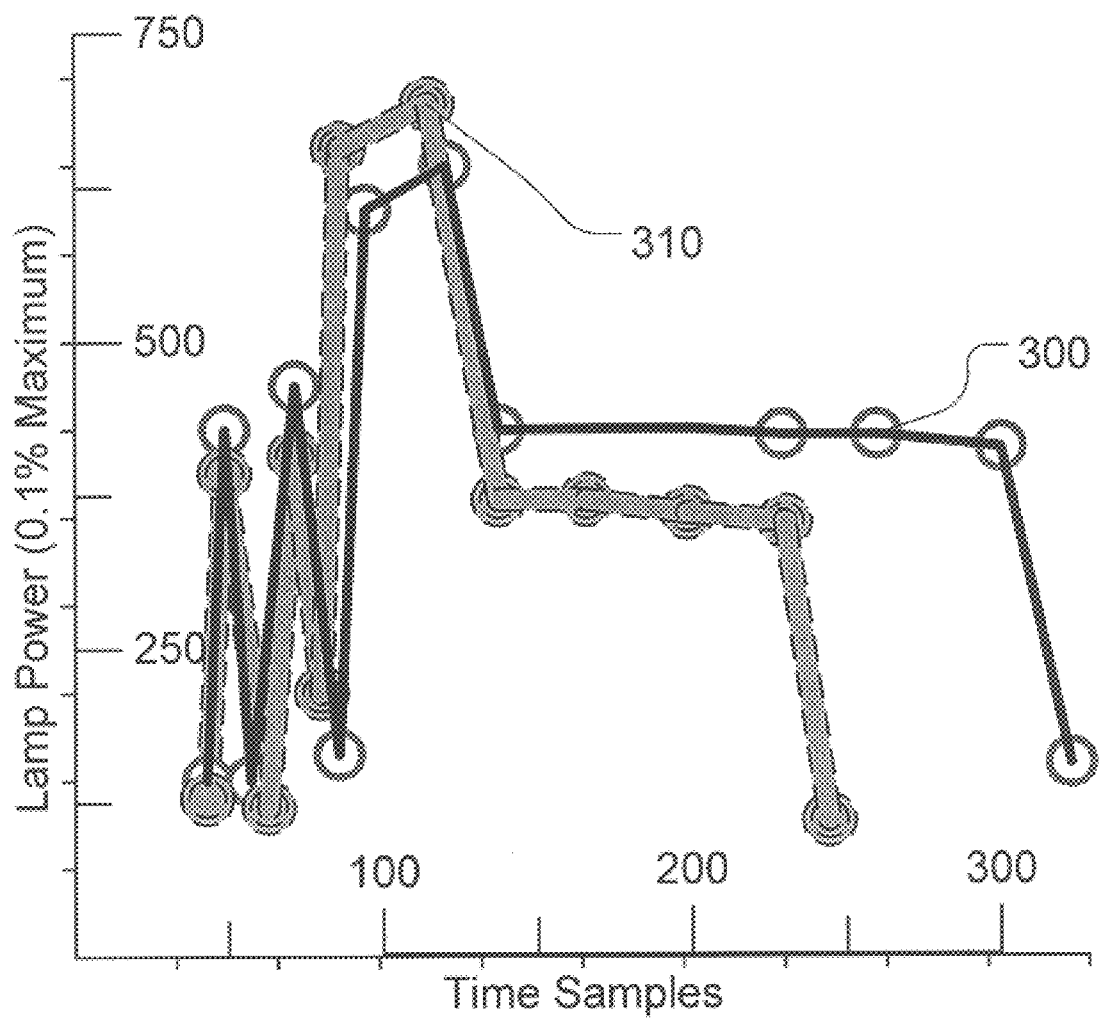
Figure 4:
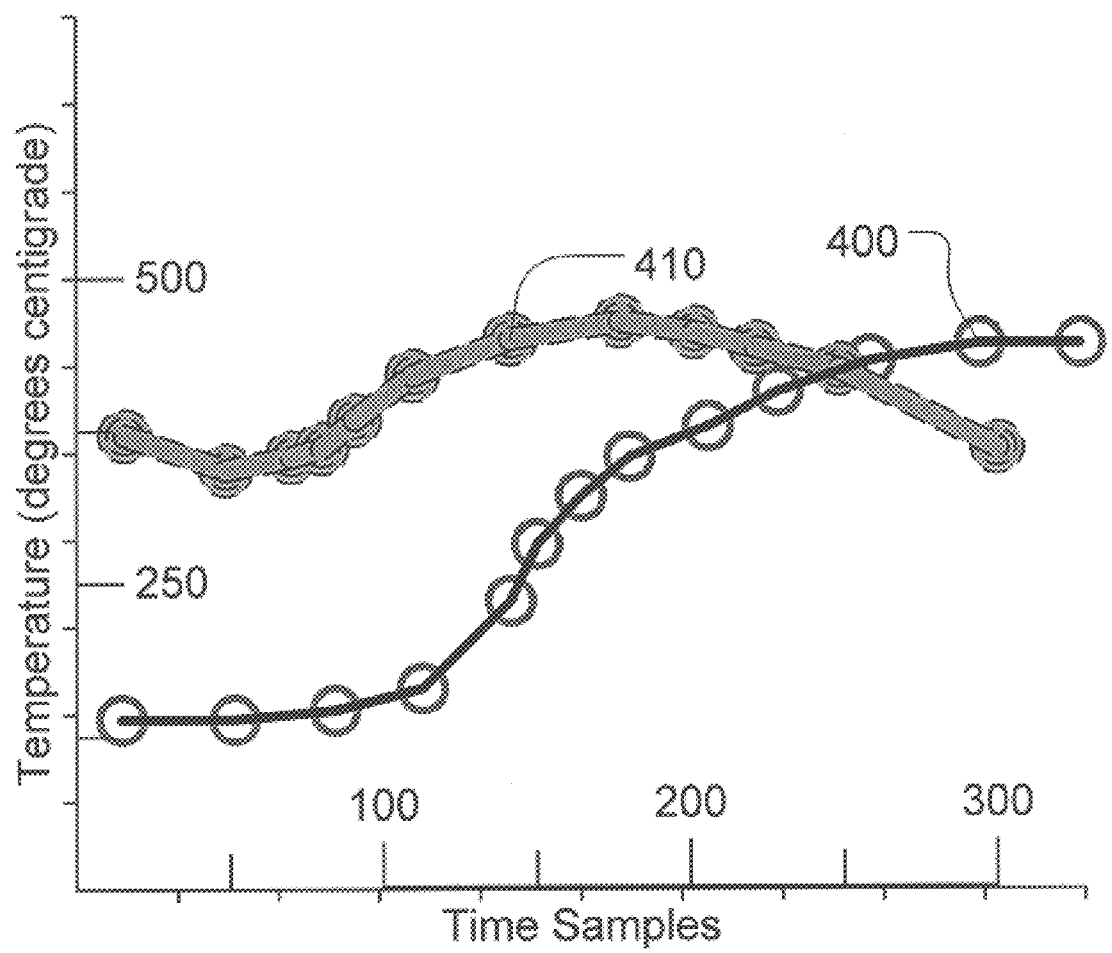

As shown in FIGS. 2–4, an optimal preheat recipe in various embodiments of the present invention may be compared to a process recipe. As shown in FIG. 2, a pyrometer trace 200 for an optimal preheat may indicate heating for a longer time, in a range of about a few seconds to about a few minutes, for example, to warm up a cold system, than a pyrometer trace 210 for a process recipe. In FIG. 2, the temperature (in degrees centigrade, ° C.) of the AST Hot Liner™ component of the wafer stand 115 measured through the quartz window 125 by the pyrometer 130 is shown along the vertical axis and successive time samples are shown along the horizontal axis.

As shown in FIG. 3, a lamp power trace 300 for the optimal preheat may also indicate heating for a longer time, in a range of about a few seconds to about a few minutes, for example, to warm up a cold system, than a lamp power trace 310 for the process recipe. In FIG. 3, the lamp power (in tenths of a percentage of maximum lamp power) of the halogen lamps 110 is shown along the vertical axis and successive time samples are shown along the horizontal axis.

As shown in FIG. 4, a tube temperature trace 400 for the optimal preheat may also indicate heating for a longer time, in a range of about a few seconds to about a few minutes, for example, to warm up a cold system, than a tube temperature trace 410 for the process recipe. In FIG. 4, the temperature (in degrees centigrade, ° C.) of the quartz tube 120 is shown along the vertical axis and successive time samples are shown along the horizontal axis.

As described above, a manufacturer of rapid thermal annealing (RTA) tools provides a quartz tube temperature reading to the tool user to better understand the process conditions, and states that by preheating the tool (with a preheat recipe similar to a production process recipe) to a set tube temperature, the tube temperature traces from the 1st workpiece 105 can be made to overlap the tube temperature traces from the 2nd through 25th workpieces 105, and, thus the system is properly preheated. From experiments and data we have produced, this preheat was found to be insufficient and sub-optimal. The 1st workpiece 105 was receiving more of an anneal (a higher temperature, in a range of about 2° C. to about 50° C.) than the rest of the lot (a "1st workpiece effect").

Figure 5:
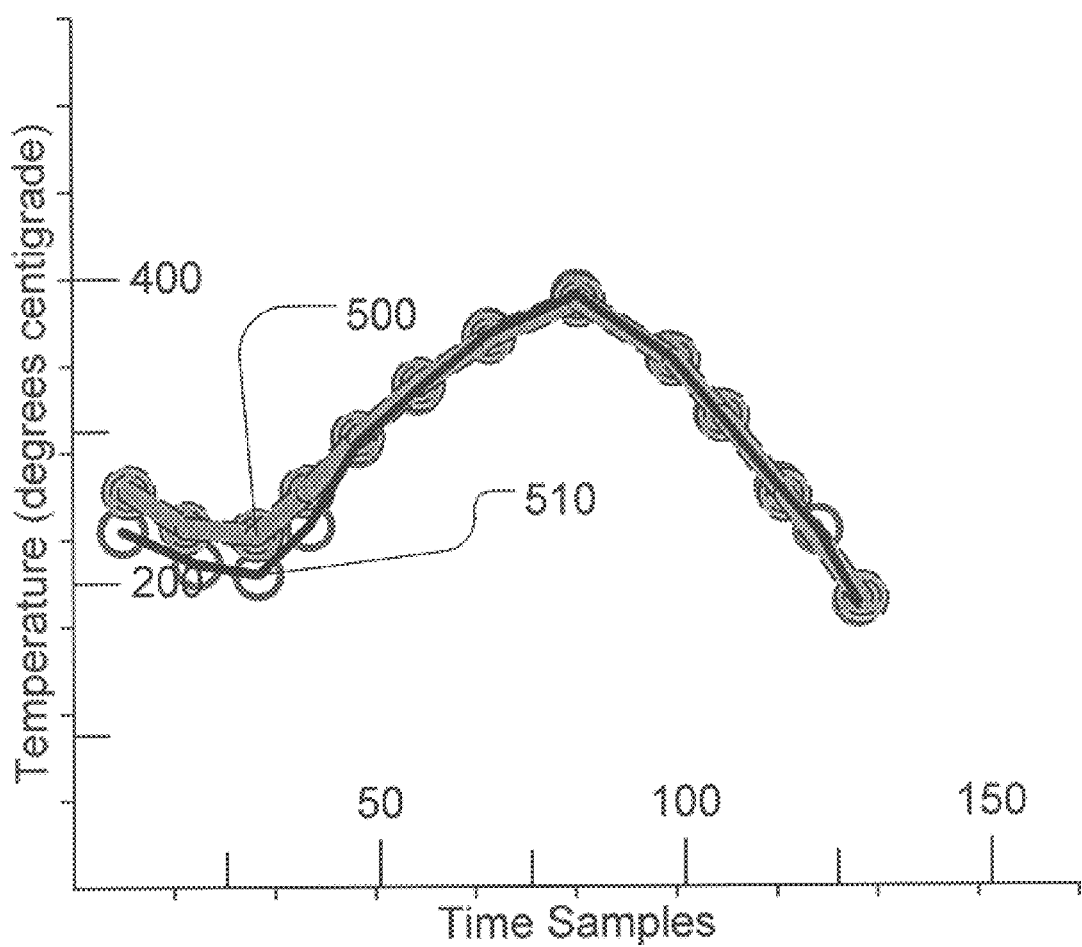

As shown in FIG. 5, we have developed various embodiments of the present invention such that a preheat recipe similar to the manufacturer's recommendation is run, but the tube temperature is overheated by a predetermined amount. In various illustrative embodiments, the tube temperature may be overheated by a predetermined amount in a range of about 2° C. to about 100° C., for example. In one illustrative embodiment, the tube temperature is overheated by about 20° C. In another illustrative embodiment, the tube temperature is overheated by about 30° C. In yet another illustrative embodiment, the tube temperature is overheated by about 50° C. This overheating can be seen in the tube temperature trace 500 of the 1st workpiece 105, which is much higher, at the start of the rapid thermal processing (RTP) for the 1st workpiece 105, than the tube temperature trace 510 at the start of the RTP for any of the following workpieces 105 (such as the 2nd through the 25th workpieces 105). In FIG. 5, the temperature (in degrees centigrade, ° C.) of the quartz tube 120 is shown along the vertical axis and successive time samples are shown along the horizontal axis.

Figure 6:
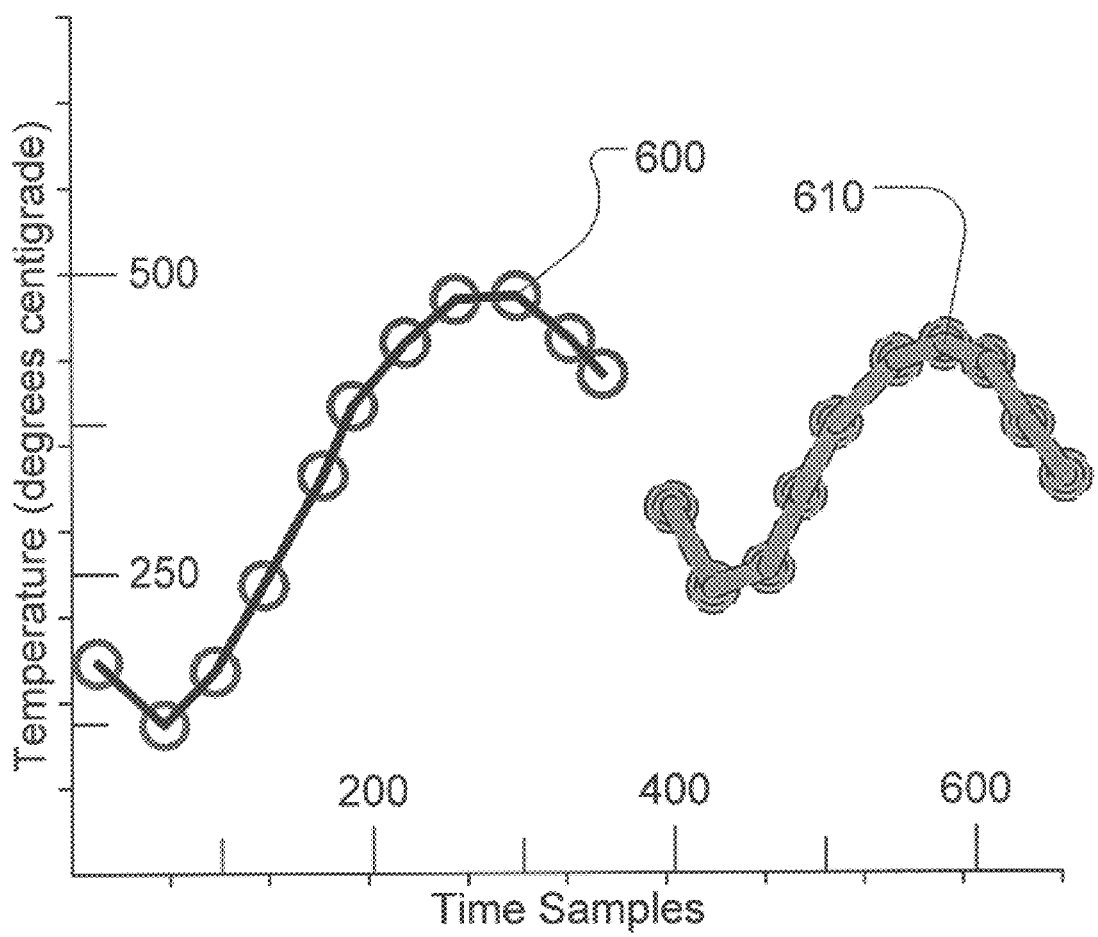

As shown in FIG. 6, a tube temperature trace 600 for an optimal preheat recipe of various embodiments of the present invention is schematically illustrated followed by a tube temperature trace 610 for the 1st workpiece 105. In FIG. 6, the temperature (in degrees centigrade, ° C.) of the quartz tube 120 is shown alone the vertical axis and successive time samples are shown along the horizontal axis.

As shown in FIG. 6, the tube temperature decreases between the preheating (according to the preheat recipe) and the RTP (according to a processing recipe) for the 1st workpiece 105. However, since the optimal preheat recipe of various embodiments of the present invention heats the quartz tube 120 to a tube temperature that is higher than the tube temperature of the RTP recipes for the workpieces 105, the tube temperature at the start of the RTP for the 1st workpiece 105 is believed to be higher than the tube temperature at the start of the RTP for any of the following workpieces 105 (such as the 2nd through the 25th workpieces 105), as shown in FIG. 5. The "overheating" of the quartz tube 120 according to the optimal preheat recipe of various embodiments of the present invention is believed to simulate for the 1st workpiece 105 (at the start of the RTP) the thermal environment (in the quartz tube 120) created by successive RTP treatments that is experienced by any of the following workpieces 105 (such as the 2nd through the 25th workpieces 105). This may be due to a number of factors, two of which are believed to be (1) that no workpiece is in the chamber during the preheat, while the 1st workpiece 105 (at the start of the RTP) is present during the first anneal, and (2) that the quartz tube 120 temperature measurement is taken at only one point along the quartz tube 120 and may not accurately reflect the entire quartz tube 120 temperature.

Figure 7:
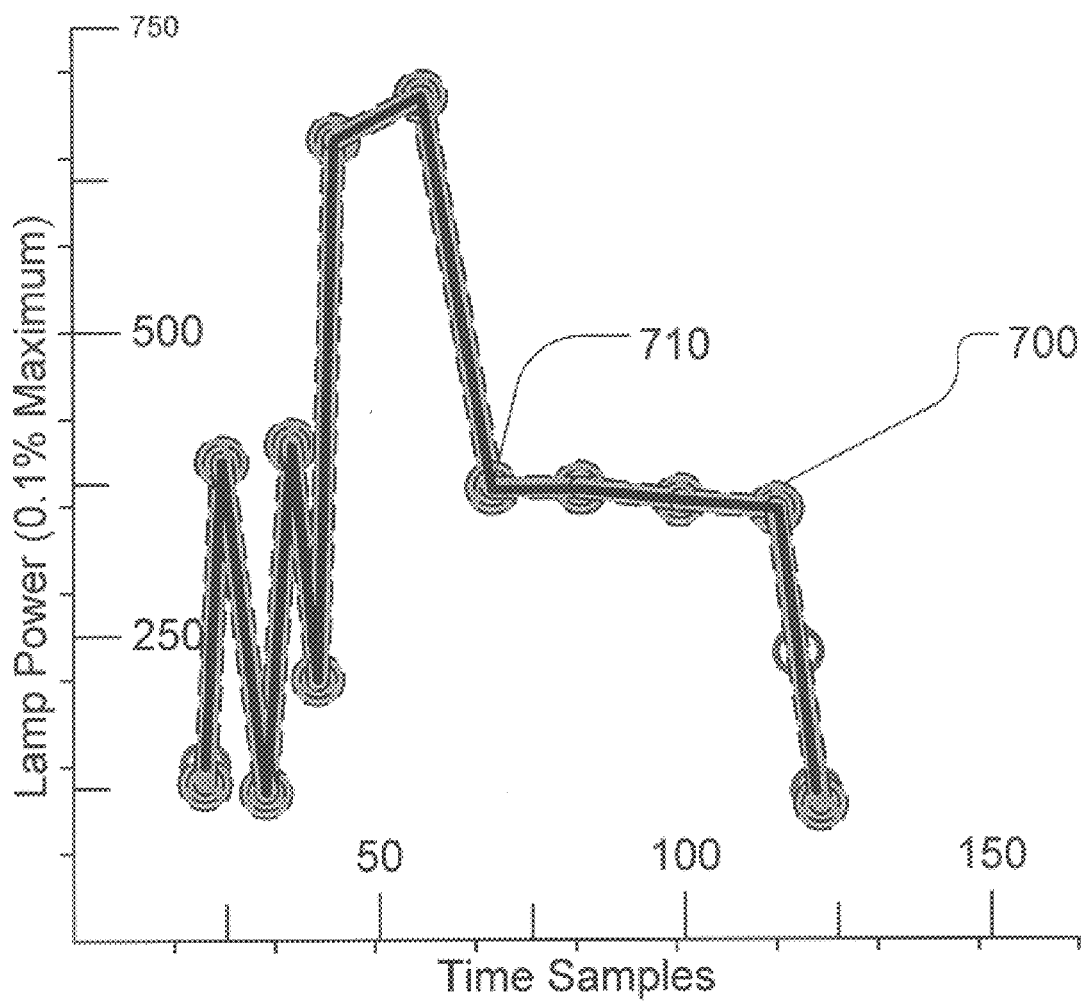

As shown in FIG. 7, this new preheat recipe of various embodiments of the present invention is considered optimal when the lamp power trace 700 of the 1st workpiece 105 closely matches the lamp power trace 710 of any of the 2nd through 25th workpieces 105. In FIG. 7, the lamp power (in tenths of a percentage of maximum lamp power) of the halogen lamps 110 is shown along the vertical axis and successive time samples are shown along the horizontal axis. It is believed that when the lamp power trace 700 of the 1st workpiece 105 is substantially the same, and/or as close as can be resolved, as the lamp power trace 710 of any of the 2nd through 25th workpieces 105, then all of the workpieces 105 in the lot (all 25 workpieces, for example) have been annealed to substantially the same extent (i.e., substantially the same amount of heating power has been applied over substantially the same amount of time).

Electrical test data from 1st workpieces 105 run after the improved preheat recipe of various embodiments of the present invention more closely matches with data from the remaining workpieces 105 in the lot. In other words, the 1st workpiece 105 has been annealed to substantially the same extent as the rest of the lot when the 1st workpiece 105 has been run after the improved preheat recipe of various embodiments of the present invention.

Figure 8:
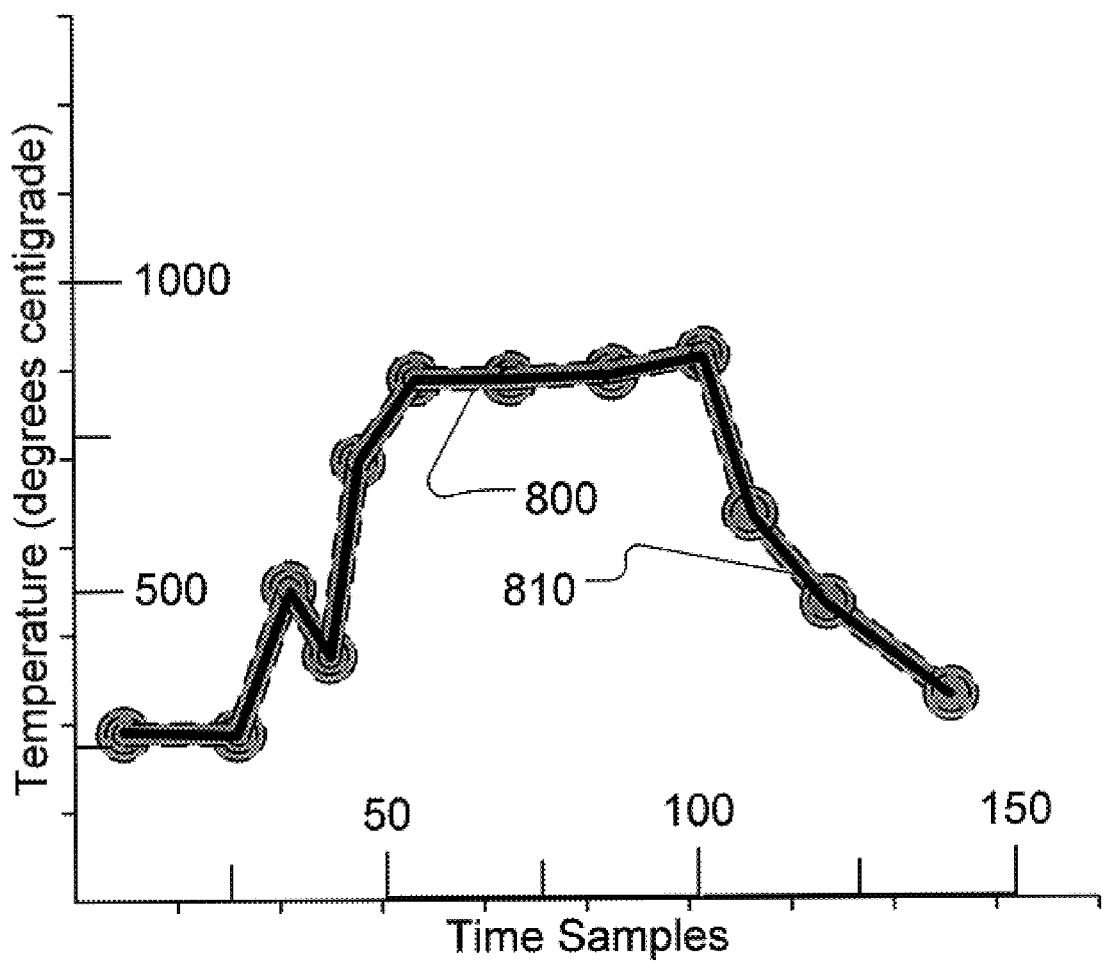

As shown in FIG. 8, an additional improvement to the preheat recipe in various embodiments of the present invention may be found by adjusting the temperature of the preheat recipe (the temperature of the wafer stand 115, such as the AST HotLiner™, as measured by the pyrometer 130, as shown in FIG. 1) such that the pyrometer trace 800 reading for the 1st workpiece 105 matches and/or overlaps the pyrometer trace 810 readings for any of the 2nd through 25th workpieces 105.

In various illustrative embodiments, the process engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such illustrative embodiments of a method of manufacturing according to the present invention, a monitoring and diagnostics system may be provided that monitors this variability and optimizes control of critical parameters.

Any of the above-disclosed embodiments of a method of manufacturing according to the present invention enables the use of central values and spreads of RTP chamber measurements to make real-time processing tool adjustments, either manually and/or automatically, to improve and/or better control the yield. In particular, the RTP chamber measurements may include temperatures and lamp power levels that workpieces are exposed to during RTP. These RTP chamber measurements may be used to optimize the RTP chamber preheating so that, as the RTP chamber heats up during successive workpiece processing, the thermal environment experienced by early workpieces will be substantially the same as the thermal environment experienced by later workpieces. In turn, this will decrease differences in workpiece processing within a lot of workpieces. Additionally, any of the above-disclosed embodiments of a method of manufacturing according to the present invention enables semiconductor device fabrication with increased reliability, increased precision, increased accuracy and increased efficiency, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, all ranges of values (of the form, "from about a to about b," or, equivalently, "from approximately a to b," or, equivalently, "from approximately a–b") disclosed herein are to be understood as referring to the power set ( the set of all subsets) of the respective ranges of values, in the sense of Georg Cantor. Accordingly, the protection sought herein is as set forth in the claims below.

What is claimed:

1. A method of manufacturing, the method comprising:

preheating a rapid thermal processing chamber according to a preheating recipe;

processing a first plurality of workpieces in the rapid thermal processing chamber;

performing first parameter measurements on first and second workpieces of the first plurality of workpieces, the first parameter measurements indicative of first processing differences between the first and second workpieces;

forming a first output signal corresponding to the first parameter measurements; and adjusting the preheating recipe based on the first output signal and using the adjusted preheating recipe to preheat the rapid thermal processing chamber for processing a second plurality of workpieces in the rapid thermal processing chamber to reduce second processing differences between first and second workpieces of the second plurality of workpieces.

2. The method of claim 1, wherein performing first parameter measurements on the first and second workpieces of the first plurality of workpieces comprises performing first parameter measurements on a first workpiece processed of the first plurality of workpieces processed and performing first parameter measurements on one of a subsequent workpiece processed of the first plurality of workpieces processed.

3. The method of claim 1, wherein performing first parameter measurements on the first and second workpieces of the first plurality of workpieces comprises measuring a first lamp power trace of a first workpiece processed of the first plurality of workpieces processed and measuring a second lamp power trace of one of a subsequent workpiece processed of the first plurality of workpieces processed.

4. The method of claim 3, wherein adjusting the preheating recipe based on the first output signal to preheat the rapid thermal processing chamber for processing the second plurality of workpieces in the rapid thermal processing chamber to reduce the second processing differences between the first and second workpieces of the second plurality of workpieces comprises adjusting the preheating recipe so that first and second lamp power traces of the first and second workpieces of the second plurality of workpieces are substantially the same.

5. The method of claim 4, wherein adjusting the preheating recipe based on the first output signal to preheat the rapid thermal processing chamber for processing the second plurality of workpieces in the rapid thermal processing chamber to reduce the second processing differences between the first and second workpieces of the second plurality of workpieces comprises adjusting the preheating recipe so that a first pyrometer reading of the first workpiece at a first start of processing of the first workpiece is substantially the same as a second pyrometer reading of the second workpiece at a second start of processing of the second workpiece.

6. The method of claim 1, further comprising:

preheating the rapid thermal processing chamber according to the adjusted preheating recipe;

processing the second plurality of workpieces in the rapid thermal processing chamber; and performing second parameter measurements on first and second workpieces of the second plurality of workpieces, the second parameter measurements indicative of second processing differences between the first and second workpieces.

7. The method of claim 6, wherein performing second parameter measurements on the first and second workpieces of the second plurality of workpieces comprises performing second parameter measurements on a first workpiece processed of the second plurality of workpieces processed and performing second parameter measurements on one of a subsequent workpiece processed of the second plurality of workpieces processed.

8. The method of claim 6, wherein performing second parameter measurements on the first and second workpieces of the second plurality of workpieces comprises measuring a first lamp power trace of a first workpiece processed of the second plurality of workpieces processed and measuring a second lamp power trace of one of a subsequent workpiece processed of the second plurality of workpieces processed.

9. The method of claim 2, further comprising:

preheating the rapid thermal processing chamber according to the adjusted preheating recipe;

processing the second plurality of workpieces in the rapid thermal processing chamber; and performing second parameter measurements on first and second workpieces of the second plurality of workpieces, the second parameter measurements indicative of second processing differences between the first and second workpieces.

10. The method of claim 9, wherein performing second parameter measurements on the first and second workpieces of the second plurality of workpieces comprises performing second parameter measurements on a first workpiece processed of the second plurality of workpieces processed and performing second parameter measurements on one of a subsequent workpiece processed of the second plurality of workpieces processed.

11. The method of claim 9, wherein performing second parameter measurements on the first and second workpieces of the second plurality of workpieces comprises measuring a first lamp power trace of a first workpiece processed of the second plurality of workpieces processed and measuring a second lamp power trace of one of a subsequent workpiece processed of the second plurality of workpieces processed.

12. The method of claim 3, further comprising:

preheating the rapid thermal processing chamber according to the adjusted preheating recipe;

processing the second plurality of workpieces in the rapid thermal processing chamber; and performing second parameter measurements on first and second workpieces of the second plurality of workpieces, the second parameter measurements indicative of second processing differences between the first and second workpieces.

13. The method of claim 12, wherein performing second parameter measurements on the first and second workpieces of the second plurality of workpieces comprises performing second parameter measurements on a first workpiece processed of the second plurality of workpieces processed and performing second parameter measurements on one of a subsequent workpiece processed of the second plurality of workpieces processed.

14. The method of claim 12, wherein performing second parameter measurements on the first and second workpieces of the second plurality of workpieces comprises measuring a first lamp power trace of a first workpiece processed of the second plurality of workpieces processed and measuring a second lamp power trace of one of a subsequent workpiece processed of the second plurality of workpieces processed.

15. A method of manufacturing, the method comprising:

preheating a rapid thermal processing chamber having at least one lamp according to a preheating recipe;

processing a plurality of workpieces in the rapid thermal processing chamber; and performing parameter measurements on first and second workpieces of the plurality of workpieces, wherein the parameter measurements indicate that a first lamp power trace of the first workpiece is substantially the same as a second lamp power trace of the second workpiece, reducing processing differences between the first and second workpieces.

16. The method of claim 15, wherein performing parameter measurements on the first and second workpieces of the plurality of workpieces comprises measuring the first lamp power trace of a first workpiece processed of the plurality of workpieces processed and measuring the second lamp power trace of one of a subsequent workpiece processed of the plurality of workpieces processed.

17. The method of claim 15, wherein the parameter measurements indicate that a first pyrometer reading of the first workpiece at a first start of processing of the first workpiece is substantially the same as a second pyrometer reading of the second workpiece at a second start of processing of the second workpiece.

18. A method of manufacturing, the method comprising:
preheating a rapid thermal processing chamber having a tube and a plurality of lamps heating the tube according to a preheating recipe;
processing a plurality of workpieces in the tube in the rapid thermal processing chamber; and
performing parameter measurements on first and second workpieces of the plurality of workpieces, wherein the parameter measurements indicate that a first tube temperature trace of the first workpiece at a first start of processing of the first workpiece is higher than a second tube temperature trace of the second workpiece at a second start of processing of the second workpiece and that a first lamp power trace of the first workpiece is substantially the same as a second lamp power trace of the second workpiece, reducing processing differences between the first and second workpieces.

19. The method of claim 18, wherein performing parameter measurements on the first and second workpieces of the plurality of workpieces comprises measuring the first lamp power trace and the first tube temperature trace of a first workpiece processed of the plurality of workpieces processed and measuring the second lamp power trace and the second tube temperature trace of one of a subsequent workpiece processed of the plurality of workpieces processed.

20. The method of claim 18, wherein the parameter measurements indicate that a first pyrometer reading of the first workpiece is substantially the same as a second pyrometer reading of the second workpiece.

* * * * *